(12) United States Patent
Hsieh et al.

(10) Patent No.: US 10,772,225 B2
(45) Date of Patent: Sep. 8, 2020

(54) AUDIO DEVICE

(71) Applicant: 1MORE INC., Shenzhen, Guangdong (CN)

(72) Inventors: Kun-Chih Hsieh, Guangdong (CN); Yonghui Hu, Guangdong (CN); Shixuan Yu, Guangdong (CN)

(73) Assignee: 1MORE INC., Shenzhen (CN)

( * ) Notice: Subject to any disclaimer, the term of this patent is extended or adjusted under 35 U.S.C. 154(b) by 0 days.

(21) Appl. No.: 16/336,997

(22) PCT Filed: Sep. 7, 2017

(86) PCT No.: PCT/CN2017/100832
§ 371 (c)(1),
(2) Date: Mar. 27, 2019

(87) PCT Pub. No.: WO2018/059204
PCT Pub. Date: Apr. 5, 2018

(65) Prior Publication Data
US 2019/0223305 A1    Jul. 18, 2019

(30) Foreign Application Priority Data

Sep. 27, 2016    (CN) ..................... 2016 2 1086326 U

(51) Int. Cl.
*H05K 5/02* (2006.01)
*H05K 5/00* (2006.01)
(Continued)

(52) U.S. Cl.
CPC ......... *H05K 5/0217* (2013.01); *G11B 33/025* (2013.01); *G11C 7/00* (2013.01);
(Continued)

(58) Field of Classification Search
CPC .. H05K 5/0217; H05K 5/0017; H05K 7/1427; H04R 2420/07; H04R 3/00; G11B 33/025; G11C 7/00
See application file for complete search history.

(56) References Cited

U.S. PATENT DOCUMENTS

| 8,502,092 B2 * | 8/2013 | Chou | H01H 25/065 |
| | | | 200/4 |
| 2011/0051360 A1 * | 3/2011 | Dabov | G06F 1/1626 |
| | | | 361/679.55 |

(Continued)

FOREIGN PATENT DOCUMENTS

| CN | 101430893 A | 5/2009 |
| CN | 201259787 Y | 6/2009 |

(Continued)

OTHER PUBLICATIONS

International Search Report in International Application No. PCT/CN2017/100832 including English Translation.

(Continued)

*Primary Examiner* — Rockshana D Chowdhury
(74) *Attorney, Agent, or Firm* — Andrew C. Cheng

(57) ABSTRACT

An audio device, comprising a housing, a circuit board, a rotating shell, a contact switch, and a trigger; the circuit board is disposed in the housing; the housing is rotatably connected to the rotating shell; the contact switch is disposed on the circuit board, and the trigger is disposed on the rotating shell; during rotation of the rotating shell relative to the housing, the trigger triggers the contact switch.

19 Claims, 2 Drawing Sheets

(51) Int. Cl.
    *H05K 7/14*     (2006.01)
    *G11B 33/02*     (2006.01)
    *G11C 7/00*     (2006.01)
    *H04R 3/00*     (2006.01)

(52) U.S. Cl.
    CPC ......... *H05K 5/0017* (2013.01); *H05K 7/1427* (2013.01); *H04R 3/00* (2013.01); *H04R 2420/07* (2013.01)

(56) References Cited

U.S. PATENT DOCUMENTS

| | | | | |
|---|---|---|---|---|
| 2014/0133670 A1* | 5/2014 | Lee | ...................... | H04R 5/0335 381/74 |
| 2016/0104355 A1* | 4/2016 | Alexander | ........... | G08B 25/009 340/692 |

FOREIGN PATENT DOCUMENTS

| | | |
|---|---|---|
| CN | 202838972 U | 3/2013 |
| CN | 203149407 U | 8/2013 |
| CN | 103633981 A | 3/2014 |
| WO | 96/15522 A1 | 5/1996 |

OTHER PUBLICATIONS

Written Opinion of the International Search Authority in International Application No. PCT/CN2017/100832.
CN 201259787 Y _ English Abstract.
CN 103633981 A _ English Abstract.
CN 202838972 U _ English Abstract.
CN 101430893 A _ English Abstract.
CN 203149407 U _ English Abstract.

\* cited by examiner

AUDIO DEVICE

RELATED APPLICATION

This application is a national phase entry under 35 USC 371 of International Patent Application No.: PCT/CN2017/100832 filed on 07 Sep. 2017, which claims priority from Chinese Application No. 201621086326.1 filed on 27 Sep. 2016, the disclosures of which are incorporated in their entirety by reference herein.

TECHNICAL FIELD

The present disclosure relates to an audio device.

BACKGROUND

Audio device is used to transmit audio signals, through which people can listen to music or receive information.

People are faced with increasing pressure from work under the influence of speeding living pace, and may relax only after work. But the traditional audio device's function is relatively simple, only playing audio, and cannot satisfy the people's demand. Current audio devices with multiple functions, in order to accommodate more functional modules, are made too large and inconvenient to carry. Also, they are not designed to be compact enough, and the operation of the whole device is extremely inconvenient.

SUMMARY

Therefore, it is necessary to provide an audio device with diversified functions, small size and convenient operation.

An audio device includes a housing, a circuit board, a rotary shell, a contact switch, and a trigger. The circuit board is disposed in the housing, the housing is rotatably connected to the rotary shell, the contact switch is disposed on the circuit board, and the trigger is disposed on the rotary shell. The trigger triggers the contact switch during rotation of the rotary shell with respect to the housing.

Details of one or more embodiments of the invention are set forth in the following figures and description. Other features, objects and advantages of the present invention will become apparent from the description, drawings, and claims.

BRIEF DESCRIPTION OF THE DRAWINGS

In order to more clearly explain embodiments of the present invention or the technical solution in the prior art, the accompany drawings which need to be used in the embodiments or the description of the prior art will be briefly described. The drawings in the following description are merely some embodiments of the invention, and other drawings may be obtained from them without creative effort by one of ordinary skill in the art.

DETAILED DESCRIPTION OF THE EMBODIMENTS

Figure 1:
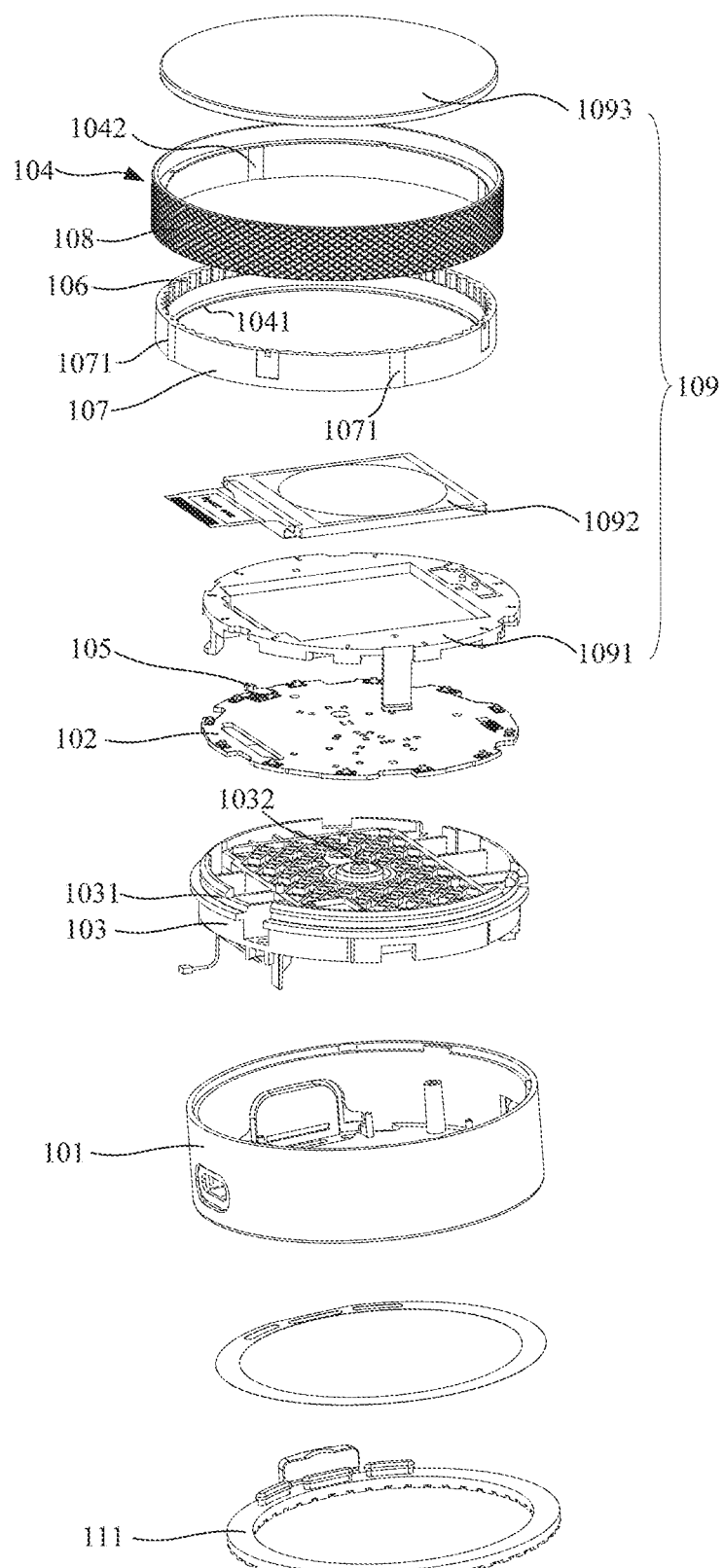
FIG. 1 is an exploded view of an audio device.

In order to facilitate understanding of the present invention, the present invention will be described more fully below with reference to the accompanying drawings. Preferred embodiments of the invention are shown in the drawings. However, the invention may be implemented in many different forms and is not limited to the embodiments described herein. Rather, the purpose of providing these embodiments is to provide a more thorough understanding of the disclosure of the present invention.

It should be noted that when the element is referred to as being "fixed" to another element, it may be directly on the other element or there may be a central element. When an element is considered "connected" to another element, it may be directly connected to the other element or a central element may be present at the same time. The terms "inside," "outside," "left," right, "and the like are used herein for illustrative purposes only and are not meant to be the only embodiments.

Figure 2:
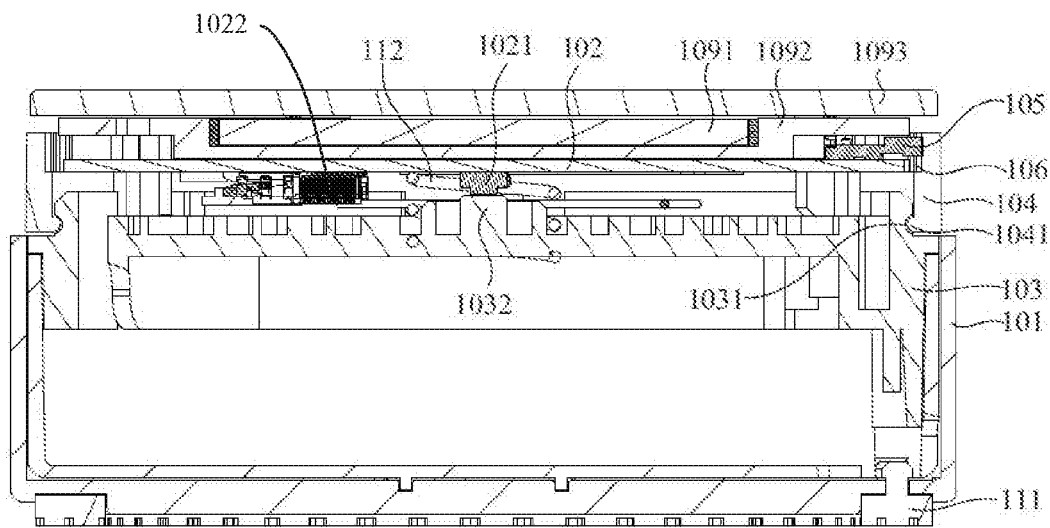
FIG. 2 is a sectional view of the audio device.
Figure 3:
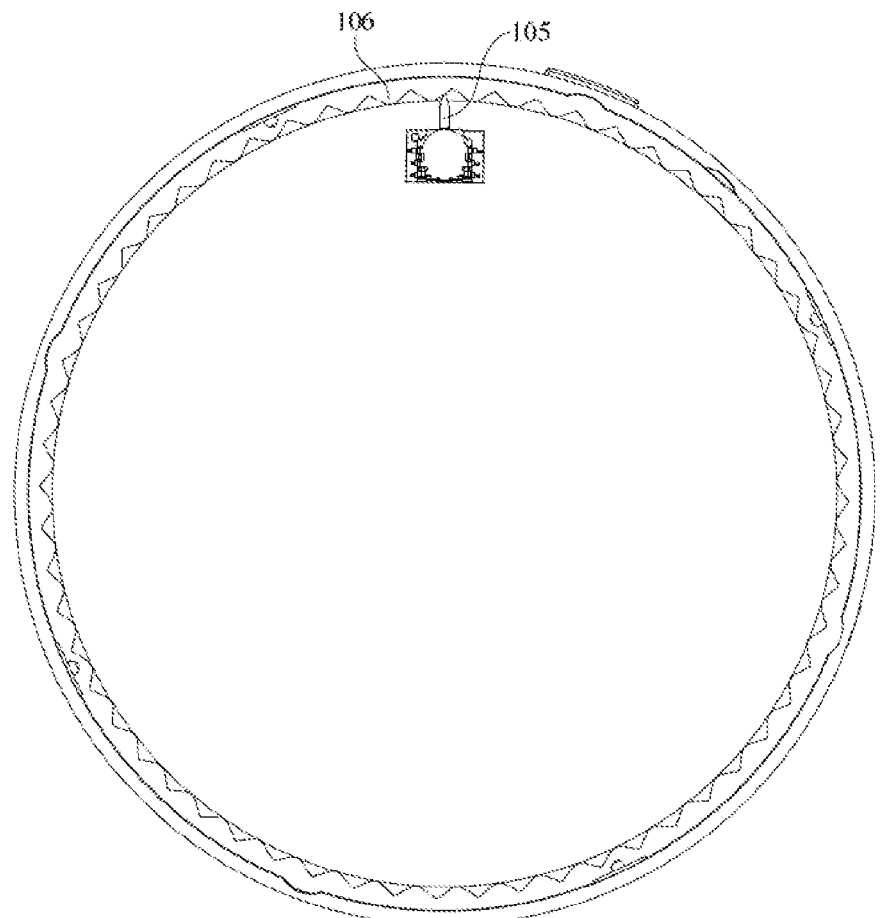
FIG. 3 is a top view of a contact switch and a rotary shell of the audio device.

With reference to FIGS. 1-3, an audio device provided by an embodiment includes a housing 101, a circuit board 102, a rotary shell 104, a contact switch 105, and a trigger 106. The circuit board 102 is disposed in the housing 101. The housing 101 is rotatably connected to the rotary shell 104, the contact switch 105 is disposed on the circuit board 102, and the trigger 106 is disposed on the rotary shell 104. The trigger 106 triggers the contact switch 105 during rotation of the rotary shell 104 with respect to the housing 101.

In the above embodiment, both of the housing 101 and the rotary shell 104 are made of metal, for example, the housing 101 and the rotary shell 104 are made of aluminum alloy.

In one embodiment, the trigger 106 is integrally formed with the rotary shell 104, i.e., the trigger 106 is made of the same aluminum alloy as the rotary shell 104, or the trigger 106 is a plastic material integrally molded on the rotary shell 104 by injection molding. As shown in FIGS. 1 and 3, it should be noted that the trigger 106 may be a plurality of protruding teeth disposed on an inner surface of the rotary shell 104 opposite to the contact switch 105. The protruding teeth have a gear-like tooth structure or similar to an arc-shaped protrusion, i.e., a plurality of protruding teeth are formed in a toothed or wavy shape as viewed in a cross-section.

In another embodiment, the trigger 106 and the rotary shell 104 have a separate structure, i.e., the rotary shell 104 includes a rotating sleeve 107. The rotating sleeve 107 is sleeved in the rotary shell 104. The rotating sleeve 107 may be made of plastic. Specifically, a plurality of inner grooves 1042 are disposed on the inner surface of the rotary shell 104, and a plurality of ribs 1071 are disposed on the outer surface of the rotating sleeve 107 to cooperate with the inner grooves 1042. By inserting the ribs 1071 into the inner grooves 1042, the rotating sleeve 107 is fixedly sleeved in the rotary shell 104. The rotary shell 104 and the rotating sleeve 107 may also be connected by means of a snap-fit. In the present embodiment, the trigger 106 may be a plurality of protruding teeth disposed on an inner surface of the rotary sleeve 107 opposite to the contact switch 105. The protruding teeth have a gear-like tooth structure or similar to an arc-shaped protrusion, i.e., a plurality of protruding teeth are formed in a toothed or wavy shape as viewed in a cross section.

In the embodiment described above, the contact switch 105 extends beyond the edge of the circuit board 102 so that the free end of the contact switch 105 is in better contact with the protruding teeth. The contact switch 105 may be a toggle switch.

In the above embodiment, an outer surface of one end of the housing 101 is provided with an annular sliding rail 1031. An inner surface of the rotary shell 104 or the rotating sleeve 107 is provided with an annular sliding block 1041 which is rotatably engaged with the annular sliding rail 1031. In other words, the annular sliding rail 1031 is located on an outer surface of the housing 101 opposite to the rotary shell 104, and the annular sliding block 1041 is located on an inner surface of the rotary shell 104 opposite to the housing 101. As such, the annular sliding block 1041 can rotate along the annular sliding rail 1031, such that the rotary shell 104 rotates with respect to the housing 101, causing the trigger 106 to trigger the contact switch 105, thereby adjusting the audio device.

In another embodiment, the housing 101 is provided with a support frame 103, and the rotary shell 104 rotates with respect to the support frame 103. In one embodiment, an outer surface of the support frame 103 is provided with the annular sliding rail 1031. An inner surface of the rotary shell 104 is provided with the annular sliding block 1041 which is rotatably engaged with the annular sliding rail 1031. In another embodiment, an outer surface of the support frame 103 is provided with the annular sliding rail 1031. An inner surface of the rotating sleeve 107 is provided with the annular sliding block 1041 which is rotatably engaged with the annular sliding rail 1031.

It should be understood that, in the above embodiment, because the annular sliding rail 1031 is rotatably engaged with the annular sliding block 1041, the arrangement of the annular sliding rail 1031 and the annular sliding block 1041 is relative, i.e., when the rotary shell 104 is provided with the annular sliding block 1041, the annular sliding block 1041 is located on the inner surface of the rotary shell 104 opposite to the support frame 103, correspondingly, the annular sliding rail 1031 is located on the outer surface of the support frame 1031 opposite to the rotary shell 104. When the rotating sleeve 107 is provided with the annular sliding block 1041, the annular sliding block 1041 is located on the inner surface of the rotating sleeve 107 opposite to the support frame 103, correspondingly, the annular sliding rail 1031 is located on the outer surface of the support frame 1031 opposite to the rotating sleeve 107.

As shown in FIGS. 2 and 3, the operation of the above embodiment is exemplified hereby. When the annular sliding block 1041 of the rotary shell 104 rotates clockwise with respect to the annular sliding rail 1031 of the housing 101 or the support frame 103, the toggle switch is toggled by one of the protruding teeth (i.e., the peak of the wave or toothed lobe) to increase the volume. As the rotation continues, the toggle switch falls into the gap between a protruding tooth and the next protruding tooth (i.e. the valley of the wave or toothed lobe), thus resetting the toggle switch and so repeating to continuously increase the volume. Similarly, when the annular sliding block 1041 of the rotary shell 104 rotates counterclockwise with respect to the housing 101 or the annular sliding rail 1031 of the support frame 103, the volume is continuously reduced.

In some embodiments, to facilitate a user's rotating the rotary shell 104 with respect to the housing 101 or the support frame 103, an outer surface of the rotary shell 104 is provided with a texture 108 for increasing friction. The texture 108 is a diamond pattern or other shaped texture.

In the above embodiment, the audio device also includes a display module 109. The display module 109 is fixed to the support frame 103. The display module 109 includes a connecting frame 1091, a monitor 1092, and a glass cover 1093. The connecting frame 1091 is fixed to the support frame 103. The monitor 1092 and the glass cover 1093 are fixed to one end of the connecting frame 1091. The glass cover 1093 covers the monitor 1092. In this embodiment, the monitor 1092 is mounted on the support frame 103, after the glass cover 1093 covers the monitor 1092, then is directly glued and fixed to the support frame 103.

Since the monitor 1092 and the glass cover 1093 are fixedly on the support frame 103, when the rotary shell 104 rotates with respect to the support frame 103, the monitor 1092 and the glass cover 1093 do not rotate together with the rotation of the rotary shell 104. In other word, when that rotary shell 104 is rotated to adjust the audio device, the monitor 1092 and the glass cover 1093 are held stationary, thereby avoiding discomfort such as dizziness when the user looks at the rotating monitor 1092 and the glass cover 1093.

In the above embodiment, the circuit board 102 is provided at the other end of the connecting frame 1091, and the circuit board 102 is provided with a key 1021. The support frame is provided with a pressing element 1032 triggering the key 1021, and correspondingly, the pressing element 1032 is located on an end surface of the support frame 103 that is provided with the annular sliding rail 1031. The pressing element 1032 may be a boss. It should be understood, the circuit board 102 is disposed on the connecting frame 1091 facing away from the display module 109, so as to be disposed opposite to the protruding column 1032. When the user presses the glass cover 1093 of the display module 109, the key 1021 moves towards the protruding column 1032, and the protruding column 1032 presses the key 1021, thereby realizing an action such as play/pause.

In some embodiments, a spring 112, which is sleeved on the periphery of the key 1021 and the protruding column 1032, is disposed between the circuit board 102 and the support frame 103, so as to prevent the pressing force of the key 1021 and the protruding column 1032 from becoming so large that the hitting force between the key 1021 and the protruding column 1032 is too much and causes a break. In other words, both ends of the spring 112 abut between the circuit board 102 and the support frame 103, and the spring 112 is sleeved on the key 1021 and the protruding column 1032. As such, when the protruding column 1032 is pressed close to the key 1021, the spring 112 may act as a buffer.

In the above embodiment, the outer periphery of the housing 101 is provide with an audio jack, a USB slot, and a memory card slot. By connecting the audio jack and the USB slot with the audio plug of an external device and the USB connector of the external device, respectively, music may be played through the external device such as a mobile phone or an earphone. The memory card slot is used to receive a memory card in which music is stored for playing the music.

In the above embodiment, the end face of the housing 101 opposite to the external placement plane is provided with an anti-slipping pad 111, i.e., the anti-slipping pad 111 is located on the end face of the house 101 away from the rotary shell 104, so that when the audio device is placed on a desktop, staying stationary with the desktop is maintained, thereby preventing the audio device from slipping out of the desktop. In addition, a rough surface texture can be provided on the outer surface of the anti-slipping pad to enhance friction and prevent sliding.

In the above embodiment, the audio device also includes a Bluetooth module 1022 for the audio device to be communicatively connected with the external device so as to play music in the external device.

An embodiment of the present disclosure provides an audio device. During the rotation between the support frame 103 of the audio device and the rotary shell 104, the touch switch 105 is triggered by the trigger 106 on the rotary shell 104, such that functions like increasing the volume when rotating clockwise and decreasing the volume when rotating counterclockwise can be implemented. The rotary shell 104 can not only trigger the touch switch 105 to implement the functions of increasing and decreasing the volume, but also can be used together with the housing 101 as the protective housing of the audio device. The product is more compact, and the operation is more convenient.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the invention is illustrated and described herein with reference to specific embodiments, the invention is not intended to be limited to the details shown. Rather, various modifications may be made in the details within the scope and range of equivalents of the claims and without departing from the invention. Therefore, the protection scope of the present invention shall be subject to the protection scope of the appended claims.

What is claimed is:

1. An audio device, comprising a housing, a circuit board, a wireless communication, a rotary shell, a contact switch, and a trigger, wherein the circuit board is fixed in the rotary shell, the wireless communication is located on the circuit board and is configured to be communicatively connected with an external device, so as to play music in the external device, the housing is rotatably connected to the rotary shell, the contact switch extends beyond an edge of the circuit board, and the trigger is disposed on the rotary shell, wherein the trigger is a protruding tooth disposed on an inner surface of the rotary shell opposite to the contact switch which is located in the rotary shell, wherein the trigger triggers the contact switch during rotation of the rotary shell with respect to the housing;
   wherein the rotary shell comprises a rotating sleeve, the rotating sleeve is sleeved in the rotary shell, and the protruding tooth is provided on an inner surface of the rotating sleeve opposite to the contact switch.

2. The audio device according to claim 1, wherein the housing is circumferentially provided with an annular sliding rail, the annular sliding rail is located on an outer surface of the housing opposite to the rotary shell, the rotary shell is circumferentially provided with an annular sliding block, the annular sliding block is located on an inner surface of the rotary shell opposite to the housing, and the annular sliding block is rotatably engaged with the annular sliding rail.

3. The audio device according to claim 1, wherein the housing is circumferentially provided with an annular sliding rail, the annular sliding rail is located on an outer surface of the housing opposite to the rotating sleeve, the rotating sleeve is circumferentially provided with an annular sliding block, the annular sliding block is located on an inner surface of the rotating sleeve opposite to the housing, and the annular sliding block is rotatably engaged with the annular sliding rail.

4. The audio device according to claim 1, wherein the housing is provided with a support frame, and the rotary shell is rotatable with respect to the support frame.

5. The audio device according to claim 4, wherein the support frame is circumferentially provided with an annular sliding rail, the annular sliding rail is located on an outer surface of the support frame opposite to the rotating sleeve; the rotating sleeve is circumferentially provided with an annular sliding block, the annular sliding block is located on an inner surface of the rotating sleeve opposite to the support frame, and the annular sliding block is rotatably engaged with the annular sliding rail.

6. The audio device according to claim 4, further comprising a display module, wherein the display module comprises a connecting frame, a monitor, and a glass cover, the connecting frame is fixed to the support frame, the monitor and the glass cover are fixed to one end of the connecting frame, and the glass cover covers the monitor.

7. The audio device according to claim 6, wherein the circuit board is provided at the other end of the connecting frame, the circuit board is provided with a key, the support frame is provided with a pressing element triggering the key, and the pressing element is located on an end surface of the support frame facing the circuit board.

8. The audio device according to claim 1, wherein the housing is provided with a support frame, and the rotary shell is rotatable with respect to the support frame.

9. The audio device according to claim 8, wherein the support frame is circumferentially provided with an annular sliding rail, the annular sliding rail is located on an outer surface of the support frame opposite to the rotary shell; the rotary shell is circumferentially provided with an annular sliding block, the annular sliding block is located on an inner surface of the rotary shell opposite to the support frame, and the annular sliding block is rotatably engaged with the annular sliding rail.

10. The audio device according to claim 8, furthering comprising a display module, wherein the display module comprises a connecting frame, a monitor, and a glass cover, the connecting frame is fixed to the support frame, the monitor and the glass cover are fixed to one end of the connecting frame, and the glass cover covers the monitor.

11. The audio device according to claim 10, wherein the circuit board is provided at the other end of the connecting frame, the circuit board is provided with a key; the support frame is provided with a pressing element triggering the key, and the pressing element is located on an end surface of the support frame facing the circuit board.

12. The audio device according to claim 1, wherein an outer surface of the rotary shell is provided with a texture for increasing friction.

13. The audio device according to claim 1, wherein the housing is provided with an anti-slipping pad located on an end surface of the housing away from the rotary shell.

14. An audio device configured to play music, comprising: a housing; a rotary shell rotatably connected to the housing, the rotary shell having an inner surface, a circuit board fixed in the rotary shell and surrounded by the inner surface of the rotary shell; a contact switch extends beyond an edge of the circuit board and located within the rotary shell; and a trigger comprising a plurality of protruding teeth formed on the inner surface of the rotary shell and opposite to the contact switch, wherein the trigger triggers the contact switch to thereby adjust the audio device during rotation of the rotary shell with respect to the housing; wherein the rotary shell comprises a rotating sleeve, the rotating sleeve is sleeved in the rotary shell, and the protruding tooth is provided on an inner surface of the rotating sleeve opposite to the contact switch.

15. The audio device according to claim 14, wherein the housing comprises a bottomed end and an open end opposite to the bottomed end, the audio device further comprises a support frame attached in the open end of the housing and covering the open end of the housing, and the rotary shell is rotatably connected to the support frame.

16. The audio device according to claim 15, further comprising a display module, wherein the circuit board is located between the display module and the support frame.

17. The audio device according to claim 15, wherein the circuit board is provided with a key, the support frame is provided with a pressing element configured to trigger the key, and the pressing element is located on an end surface of the support frame facing the circuit board.

18. The audio device according to claim 14, wherein the audio device further comprises a connecting device configured to be communicatively connected with an external device, so as to play music in the external device.

19. The audio device according to claim 18, wherein the connecting device comprises at least one of an audio jack, a USB slot and a memory card slot defined in the housing, or a wireless communication module located on the circuit board.

\* \* \* \* \*